(12) United States Patent
Demirer et al.

(10) Patent No.: US 10,754,260 B2
(45) Date of Patent: Aug. 25, 2020

(54) METHOD AND SYSTEM FOR PROCESS CONTROL WITH FLEXIBLE SAMPLING

(71) Applicant: KLA-Tencor Corporation, Milpitas, CA (US)

(72) Inventors: Onur Demirer, Austin, TX (US); Roie Volkovich, Hadera (IL); William Pierson, Austin, TX (US); Mark Wagner, Rehovot (IL); Dana Klein, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 82 days.

(21) Appl. No.: 15/184,612

(22) Filed: Jun. 16, 2016

(65) Prior Publication Data

US 2016/0370718 A1    Dec. 22, 2016

Related U.S. Application Data

(60) Provisional application No. 62/181,200, filed on Jun. 18, 2015, provisional application No. 62/221,588, filed on Sep. 21, 2015.

(51) Int. Cl.
| | | |
|---|---|---|
| *G01C 9/00* | (2006.01) | |
| *G01C 1/00* | (2006.01) | |
| *G03F 7/20* | (2006.01) | |

(52) U.S. Cl.
CPC ...... *G03F 7/70633* (2013.01); *G03F 7/70625* (2013.01)

(58) Field of Classification Search
CPC .......................... G03F 7/70633; G03F 7/70625
(Continued)

(56) References Cited

U.S. PATENT DOCUMENTS

| 6,442,496 B1 | 8/2002 | Pasadyn et al. |
| 6,988,045 B2 | 1/2006 | Purdy |

(Continued)

FOREIGN PATENT DOCUMENTS

| JP | 2008516447 A | 5/2008 |
| KR | 10-2014-0111935 A | 9/2014 |

(Continued)

OTHER PUBLICATIONS

Pellegrini et al., "Super Sparse Overlay Sampling Plans: An Evaluation of Methods and Algorithms for Optimizing Overlay Quality Control and Metrology Tool Throughput", Mar. 1999.*

(Continued)

*Primary Examiner* — Michael P Nghiem
(74) *Attorney, Agent, or Firm* — Suiter Swantz pc llo

(57) ABSTRACT

The generation of flexible sparse metrology sample plans includes receiving a full set of metrology signals from one or more wafers from a metrology tool, determining a set of wafer properties based on the full set of metrology signals and calculating a wafer property metric associated with the set of wafer properties, calculating one or more independent characterization metrics based on the full set of metrology signals, and generating a flexible sparse sample plan based on the set of wafer properties, the wafer property metric, and the one or more independent characterization metrics. The one or more independent characterization metrics of the one or more properties calculated with metrology signals from the flexible sparse sampling plan is within a selected threshold from one or more independent characterization metrics of the one or more properties calculated with the full set of metrology signals.

30 Claims, 8 Drawing Sheets

(58) Field of Classification Search
USPC .................................................. 702/134, 150
See application file for complete search history.

(56) References Cited

U.S. PATENT DOCUMENTS

| | | | |
|---|---|---|---|
| 7,076,321 | B2 | 7/2006 | Purdy |
| 7,282,942 | B2 | 10/2007 | Merwah |
| 7,487,054 | B2 | 2/2009 | Ayala et al. |
| 7,577,537 | B2 | 8/2009 | Behm et al. |
| 8,017,411 | B2 | 9/2011 | Sonderman et al. |
| 8,175,831 | B2 | 5/2012 | Izikson et al. |
| 8,214,771 | B2 | 7/2012 | Adel et al. |
| 8,392,009 | B2 | 3/2013 | Fei et al. |
| 8,873,054 | B2 | 10/2014 | Kandel et al. |
| 8,948,494 | B2 | 2/2015 | Plihal et al. |
| 9,080,991 | B2 | 7/2015 | Chuang et al. |
| 10,031,426 | B2 | 7/2018 | Chang et al. |
| 2007/0237383 | A1 | 10/2007 | Funk et al. |
| 2008/0049226 | A1 | 2/2008 | Mieher et al. |
| 2009/0259605 | A1* | 10/2009 | Opsal ............... G01B 11/0641 706/15 |
| 2011/0202298 | A1 | 8/2011 | Izikson et al. |
| 2011/0228263 | A1 | 9/2011 | Chuang et al. |
| 2011/0279819 | A1 | 11/2011 | Chuang et al. |
| 2012/0299922 | A1* | 11/2012 | Ha ............... G06T 15/506 345/426 |
| 2013/0035888 | A1* | 2/2013 | Kandel ............... G03F 7/70633 702/81 |
| 2014/0136137 | A1 | 5/2014 | Tarshish-Shapir et al. |
| 2014/0301630 | A1 | 10/2014 | Kulkarni et al. |
| 2014/0354969 | A1 | 12/2014 | Elings et al. |
| 2015/0015870 | A1* | 1/2015 | Lin ............... H01L 22/12 356/72 |
| 2015/0025846 | A1 | 1/2015 | Klein et al. |
| 2015/0241790 | A1* | 8/2015 | Pierson ............... G03F 7/70483 702/35 |
| 2016/0097677 | A1* | 4/2016 | Shachaf ............... G01J 3/28 702/189 |
| 2016/0131983 | A1* | 5/2016 | Holovinger ............. H01L 22/12 356/401 |
| 2016/0334716 | A1* | 11/2016 | Mieher ............... G03F 7/70641 |
| 2017/0038201 | A1* | 2/2017 | Bozdog ............... G01B 15/02 |

FOREIGN PATENT DOCUMENTS

| | | |
|---|---|---|
| TW | 201507045 A | 2/2015 |
| WO | 2014074873 A1 | 5/2014 |
| WO | WO2017/053150 * | 3/2017 |

OTHER PUBLICATIONS

Rohm Matthias et al., Overlay Leaves Litho: Impact of Non-Litho Processes on Overlay and Compensation, Proc. of SPIE, vol. 9231, 30th European Mask and Lithography Conference, © 2014 SPIE, Oct. 2014, pp. 92310O-1-92310O-10.

Tetyana Shapoval et al., Influence of the process-induced asymmetry on the accuracy of overlay measurements, Proc. of SPIE, vol. 9424, Metrology, Inspection, and Process Control for Microlithography XXIX, © 2015 SPIE, Mar. 2015, pp. 94240B-1-94240B-9.

Chandra Mouli et al., Adaptive Metrology Sampling techniques enabling higher precision in variability detection and control, 2007 IEEE/SEMI Advanced Semiconductor Manufacturing Conference, Jun. 2007, IEEE, pp. 12-17.

Office Action dated Feb. 12, 2020 for TW Patent Application No. 105130494.

* cited by examiner

METHOD AND SYSTEM FOR PROCESS CONTROL WITH FLEXIBLE SAMPLING

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)).

RELATED APPLICATIONS

For purposes of the USPTO extra-statutory requirements, the present application constitutes a non-provisional patent application of U.S. Provisional Patent Application entitled COMPOSITE WAFER CONTROL USING FLEXIBLE SAMPLING, naming Onur Demirer, William Pierson and Roie Volkovich as inventors, filed Jun. 18, 2015 Application Ser. No. 62/181,200, which is incorporated herein by reference in the entirety.

For purposes of the USPTO extra-statutory requirements, the present application constitutes a non-provisional patent application of United States Provisional Patent Application entitled OPTIMIZING SAMPLING BASED ACCURACY, naming Mark Wagner, Roie Volkovich, Dana Klein, Bill Pierson and Onur Demirier as inventors, filed Sep. 21, 2015 Application Ser. No. 62/221,588, which is incorporated herein by reference in the entirety.

TECHNICAL FIELD

The present invention generally relates to wafer metrology for lithography process control, and, in particular, to the generation of flexible sampling plans for reducing noise and improving feedback process tool feedback correction.

BACKGROUND

Fabricating semiconductor devices such as logic and memory devices typically includes processing a substrate, such as a wafer, using a large number of fabrication processes to form various features and multiple levels of the devices. For example, lithography is a fabrication process that involves transferring a pattern from a reticle/mask to a resist arranged on a wafer. Additional examples of fabrication processes include, but are not limited to, chemical-mechanical polishing (CMP), etching, deposition, and ion implantation.

As used throughout the present disclosure, the term "wafer" generally refers to substrates formed of a semiconductor or non-semiconductor material. For example, a semiconductor or non-semiconductor material may include, but is not limited to, monocrystalline silicon, gallium arsenide or indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed. One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art may be fabricated.

Metrology processes are used at various steps during a semiconductor manufacturing process to monitor process control during device fabrication. Types of metrology process used for process control include overlay metrology, critical dimension (CD) metrology, wafer geometry metrology and etc. For example, during a process step, such as a lithographic processing step, overlay error may occur between a current and previous layer of the semiconductor device. Overlay is defined as the misregistration between the current layer of a semiconductor device and one or multiple previous layers of the semiconductor device. Overlay errors can arise for various reasons, including lithography tool (scanner) errors, wafer geometry induced errors, etch induced errors and the like. In order to control overlay and minimize overlay errors during fabrication of a semiconductor device, a feedback control system is applied. Feedback control system rely on i) measuring overlay using a metrology tool; ii) calculating the scanner correctables that would minimize overlay; and iii) feeding these corrections back through an advanced process control (APC) algorithm. Conventional overlay control schemes rely on measuring a fixed subset of overlay targets (i.e., static sampling plan) on the wafers for modeling overlay errors and calculating the scanner correctables.

Previous applications of overlay metrology use static sampling plans, where every wafer measured in every lot receives the same sampling plan. In this case, the sampling plan represents a selected subset of all available overlay targets on the wafers. As a result, it is often the case that a periodic "dense map" measurement is performed, where some wafers are measured using a very dense overlay sampling plan (e.g., thousands of targets), so that field-by-field corrections can be generated. These periodic measurements take time and effort. In addition, this procedure must be repeated in order to correct for significantly irregular and high order overlay signatures. Additional approaches include relying on an advanced field-by-field extrapolated modeling technique, where information from the static sampling plan is used to calculate field-by-field corrections without relying on periodic dense map measurements. Such an approach requires extensive optimization and a careful setup. In addition, extrapolation techniques are less useful for some irregular overlay signatures.

As the dimensions of semiconductor devices decrease, metrology processes become even more important to the successful manufacture of acceptable semiconductor devices. As such, it would be advantageous to provide a system and method that provides improved metrology capabilities and cures the deficiencies of prior approaches as identified above.

SUMMARY

A system for forming a virtual dense sample map using multiple flexible sparse sampling plans is disclosed. In one embodiment, the system includes a metrology sub-system configured to perform one or more metrology measurements on one or more wafers of a lot of wafers. In another embodiment, the system includes a controller communicatively coupled to one or more portions of the metrology sub-system. In another embodiment, the controller includes one or more processors configured to execute program instructions configured to cause the one or more processors to: generate a plurality of flexible sparse sampling plans based on the one or more metrology measurements of the one or more wafers received from the metrology sub-system; direct the metrology sub-system to perform metrology measurements on two or more wafers at the locations of the plurality of flexible sparse sampling plans, wherein each flexible sparse sampling plan is associated with one of the two or more wafers; form a virtual dense map of metrology signals by combining results from the metrology measurements performed at the locations of the plurality of flexible sampling plans; and calculate a set of process tool correctables based on the virtual dense map of metrology signals.

A system for generating one or more flexible sparse sampling plans is disclosed. In one embodiment, the system includes a metrology sub-system configured to perform one or more metrology measurements on one or more wafers. In another embodiment, the system includes a controller communicatively coupled to one or more portions of the metrology sub-system. The controller includes one or more processors configured to execute program instructions configured to cause the one or more processors to receive a full set of metrology signals from the one or more wafers from the metrology sub-system. In another embodiment; determine a set of wafer properties based on the full set of metrology signals and calculate a wafer property metric associated with the set of wafer properties; calculate one or more independent characterization metrics based on the full set of metrology signals; and generate a flexible sparse sampling plan based on the set of wafer properties, the wafer property metric, and the one or more independent characterization metrics, wherein the one or more independent characterization metrics of the one or more properties calculated with metrology signals from the flexible sparse sampling plan is within a selected threshold from one or more independent characterization metrics of the one or more properties calculated with the full set of metrology signals.

A system for generating one or more flexible sparse sampling plans is disclosed. In one embodiment, the system includes a metrology sub-system configured to perform one or more metrology measurements on one or more wafers. In another embodiment, the system includes a controller communicatively coupled to one or more portions of the metrology sub-system. The controller includes one or more processors configured to execute program instructions configured to cause the one or more processors to: receive a full set of metrology signals from the one or more wafers from the metrology sub-system; determine a set of wafer properties based on the full set of metrology signals and calculate a set of accuracy merits for the set of wafer properties; calculate a statistical metric associated with each of the set of accuracy merits for the set of wafer properties; and generate a flexible sparse sampling plan based on the statistical metrics associated with each of the set of accuracy merits.

A system for generating one or more flexible sparse sampling plans is disclosed. In one embodiment, the system includes a metrology sub-system configured to perform one or more metrology measurements on one or more wafers. In another embodiment, the system includes a controller communicatively coupled to one or more portions of the metrology sub-system. The controller includes one or more processors configured to execute program instructions configured to cause the one or more processors to: receive a full set of metrology signals from the one or more wafers from the metrology sub-system; determine a set of wafer properties based on the full set of metrology signals and calculate a set of accuracy merits for the set of wafer properties; and generate a flexible sparse sampling plan based on the set of accuracy merits, wherein the flexible sparse sampling plan is generated by identifying target locations within the full sampling plan displaying accuracy merit values below a selected threshold.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 4, a method and system for generation of flexible sampling plans for using in process tool correction are described in accordance with the present disclosure. Embodiments of the present disclosure are directed to the generation of flexible sparse sampling plans, which represent a sub-set of the available metrology target locations of one or more wafers of a lot of wafers. Additional embodiments of the present disclosure are directed to the generation of composite wafer corrections using metrology data obtained using multiple flexible sparse plans. The flexible sparse sampling plans may be generated based on the analysis of one or more independent metrics (e.g., accuracy merits), such as, but not limited to, a process signature metric (e.g., PSQ), a patterned wafer geometry metric (e.g., PWG), an overlay target asymmetry metric (e.g., Qmerit) or overlay target accuracy metric (e.g., overlay target accuracy flag).

Figure 1A:
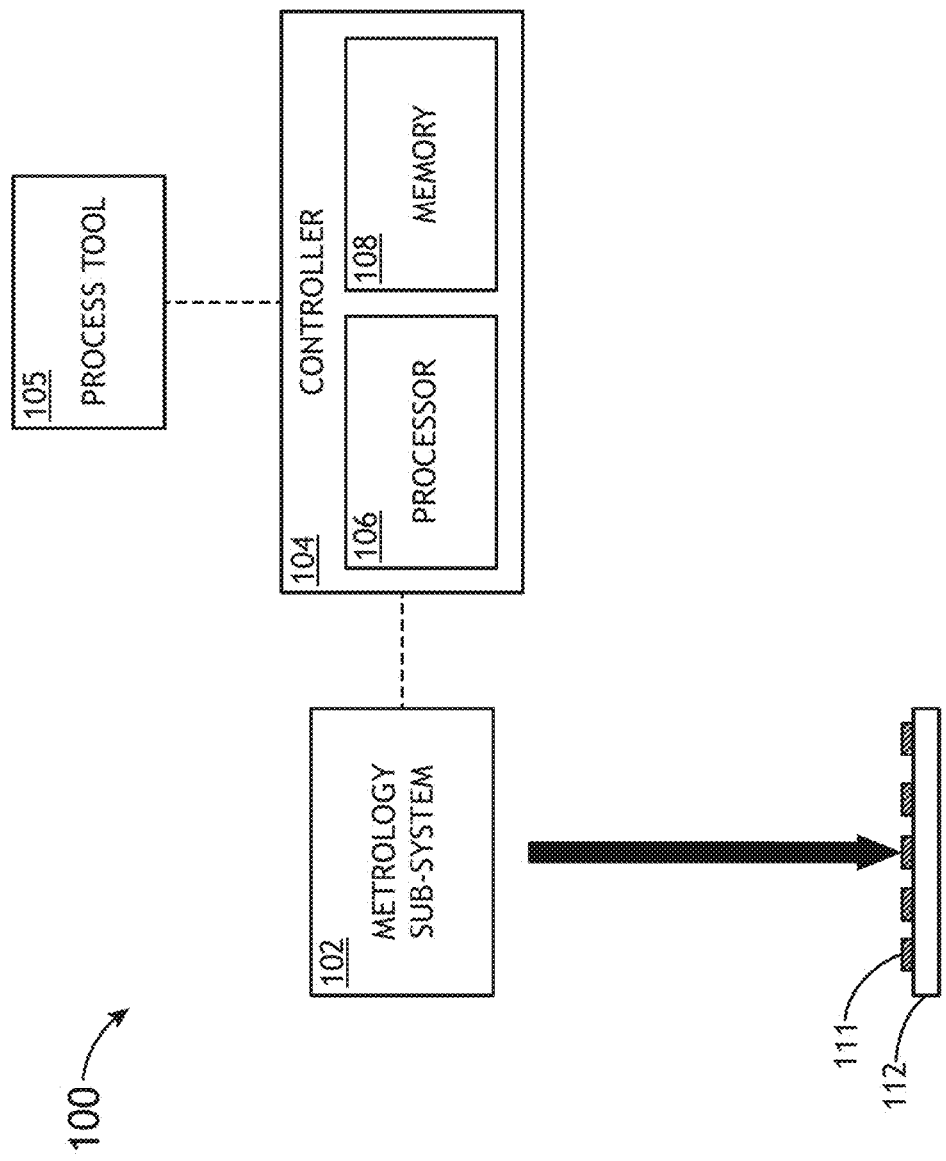
FIG. 1A is a conceptual block diagram view of a metrology system for measuring metrology targets of a semiconductor wafer, in accordance with one embodiment of the present disclosure.
Figure 1C:
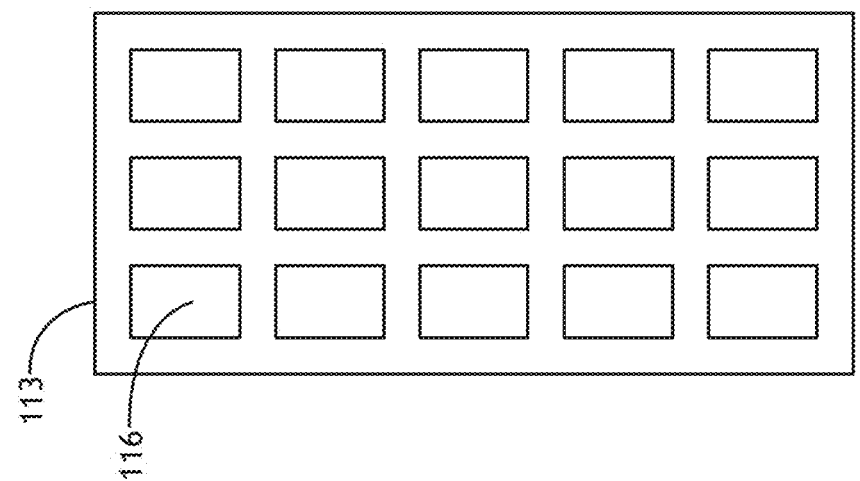
FIG. 1C illustrates a top plan view of an individual field of a semiconductor wafer showing a plurality of targets within the field, in accordance with one embodiment of the present disclosure.
Figure 1B:
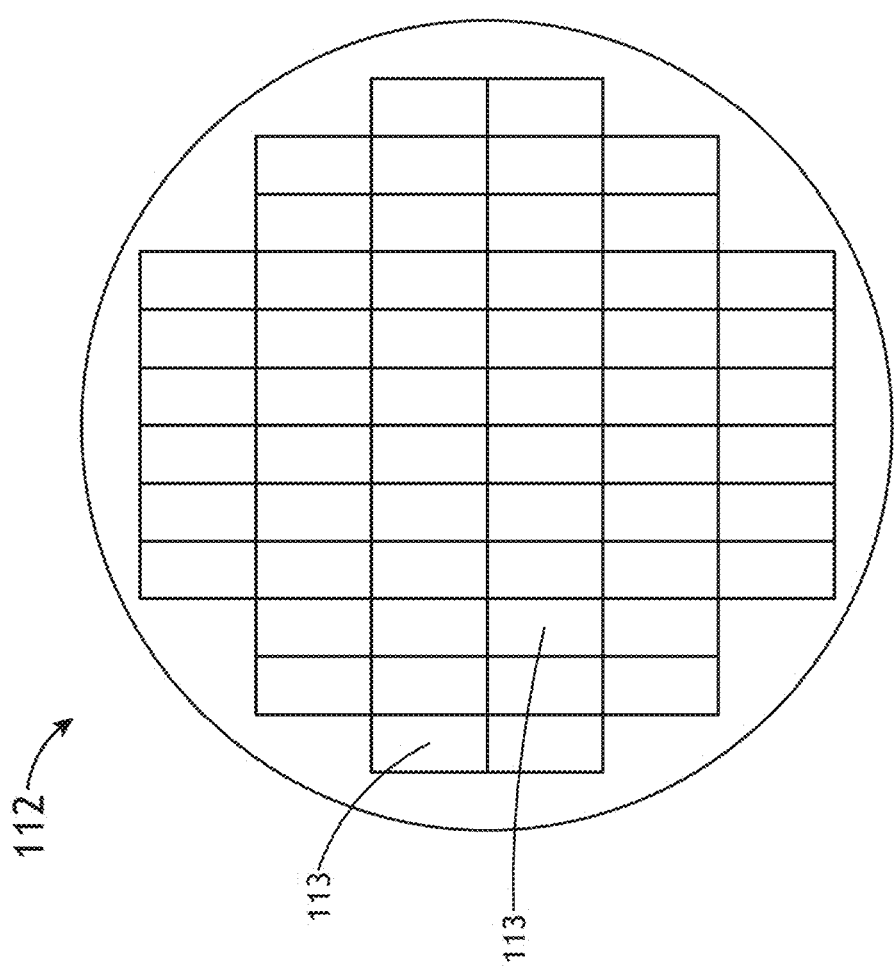
FIG. 1B illustrates a top plan view of a semiconductor wafer with demarked fields, in accordance with one embodiment of the present disclosure.

FIG. 1A illustrates a conceptual block diagram view of a metrology system 100 for performing one or more metrology measurements in accordance with one or more embodiments of the present disclosure. In one embodiment, the system 100 includes a metrology sub-system 102. The metrology sub-system 102 is configured to measure one or more characteristics of one or more metrology targets 111 of wafer 112. For example, the metrology sub-system 102 may be configured for measuring/characterizing one or more of overlay metrology targets, optical critical dimension (CD) targets or focus/dose targets. For example, the metrology sub-system 102 may measure one or more metrology targets 116 in one or more fields 113 of a wafer, as depicted in FIGS. 1B-1C.

It is noted that for purposes of simplicity the metrology system 100 has been depicted in a simplified block diagram. This depiction, including the components and geometrical configuration, is not limiting and is provided for illustrative purposes only. It is recognized herein that the metrology system may include any number of optical elements, illumination sources and detectors to carry out the metrology processes described herein (e.g., overlay metrology, CD metrology, focus/dose metrology), which may be based on metrology measurement techniques, such as contrast-based imaging, scatterometry, ellipsometry, SEM and/or AFM techniques.

Figure 1D:
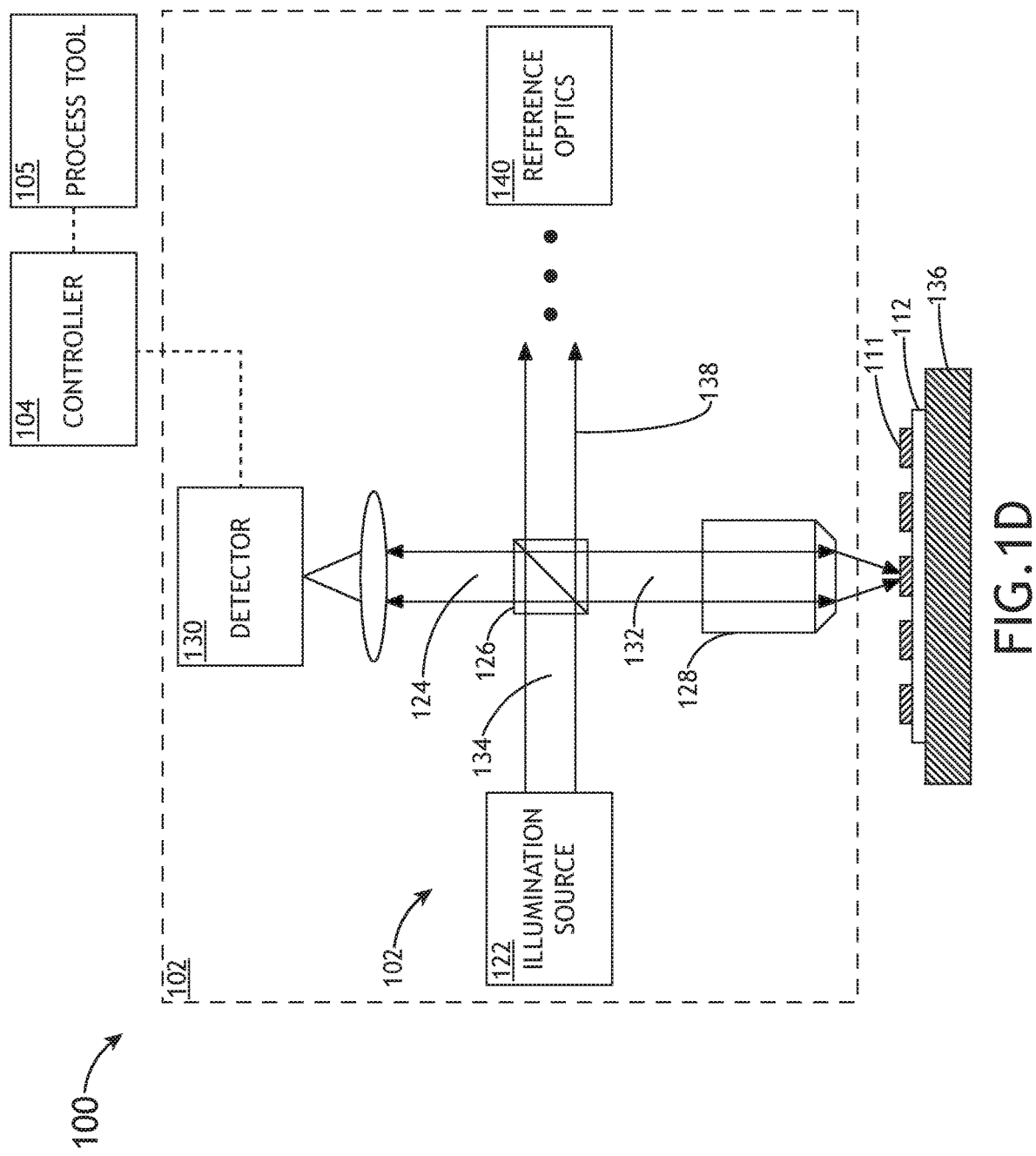
FIG. 1D is a block diagram view of an imaging-based metrology system for measuring metrology targets of a semiconductor wafer, in accordance with one embodiment of the present disclosure.

In one embodiment, the metrology sub-system 102 includes an overlay metrology sub-system or tool. In one embodiment, as shown in FIG. 1D, the metrology sub-system 102 is an imaging-based metrology sub-system. For example, the imaging-based metrology sub-system is configured to measure one or more contrast-based field images of one or more targets 111 of wafer 112 disposed on stage 136.

In one embodiment, in the case of imaging-based metrology, the system 100 may include an illumination source 122 configured to generate illumination 134, a detector 130 configured to collect light reflected from one or more metrology targets 111 of one or more wafers 119 (e.g., one or more wafers of one or more wafer lots) and one or more optical elements. In one embodiment, the one or more optical elements (e.g., beam splitter 126 and the like) are configured to direct a first portion of illumination from the illumination source 122 along an object path 132 to one or more metrology targets 111 disposed on one or more process layers of a wafer 112 disposed on stage 136. Further, a second portion of light from the illumination source 122 is directed along reference path 138 to the one or more reference optics 140.

The illumination source 122 of the system 100 may include any illumination source known in the art. In one embodiment, the illumination source 122 may include a broadband light source. For example, the illumination source 122 may include, but is not limited to, a halogen light source (HLS), an arc lamp or a laser sustained plasma light source. In another embodiment, the illumination source 122 may include a narrowband light source. For example, the illumination source 122 may include, but is not limited to, one or more lasers.

In one embodiment, the one or more optical elements of the system 100 may include, but are not limited to, one or more beam splitters 126. For example, the beam splitter 126 may split the light beam 134 emanating from the illumination source 122 into two paths: an object path 132 and a reference path 138. In this sense, the object path 132 and the reference path 138 may form a portion of a two beam interference optical system. For example, the beam splitter 126 may direct a first portion of the beam of light from the illumination path 134 along the object path 132, while allowing a second portion of the beam of light from the illumination path 134 to be transmitted along the reference path 138. The beam splitter 126 may transmit a portion of light from the illumination path 134 along the reference path 138 to reference optics 140, such as, but not limited to, a reference mirror.

The reference path 138 and reference optics 140 may include any optic elements known in the art of image-based overlay metrology including, but not limited to, a reference mirror, a reference objective, and a shutter configured to selectively block the reference path 138. In a general sense, a two-beam interference optical system may be configured as a Linnik interferometer. Linnik interferometry is described generally in U.S. Pat. No. 4,818,110, issued on Apr. 4, 1989, and U.S. Pat. No. 6,172,349, issued on Jan. 9, 2001, which are incorporated herein by reference in their entirety.

In another embodiment, the system 100 may include an objective lens 128. The objective lens 128 may aid in directing light along the object path 132 to the surface of the wafer 112 disposed on the stage 136. Following the splitting process by the beam splitter 126, the objective lens 128 may focus light from the object path 132, which may be collinear with the primary optical axis, onto the metrology targets 111 of the wafer 112. Any objective lens known in the art may be suitable for implementation in this embodiment.

Further, a portion of the light impinging on the surface of the wafer 112 may be reflected, scattered or diffracted by the metrology targets 111 of the wafer 112 and directed along the primary optical axis 124 via the objective 128 and the beam splitter 126 toward the detector 130. It should be further recognized that intermediate optical devices such as intermediate lenses, mirrors, additional beam splitters, filters, polarizers, imaging lenses and the like may be placed between the objective 128 and the detector 130.

In another embodiment, the detector 130 may be arranged to collect imagery data from the surface of the wafer 112. For example, after reflecting or scattering from the surface of the wafer 112, light may travel along the primary optical axis 124 to the detector 130. It is recognized that any detector system known in the art is suitable for implementation in this embodiment. For example, the detector 130 may include a charge coupled device (CCD) based camera system. By way of another example, the detector 130 may include a time delay integration (TDI)-CCD based camera system. In a further aspect, the detector 130 may be communicatively coupled with controller 104. In this regard, digitized imagery data may be transmitted from the detector 130 to the controller 104 via a signal, such as a wireline signal (e.g., copper line, fiber optic cable, and the like) or a wireless signal (e.g., wireless RF signal). In turn, as described in more detail further herein, the controller 104 may calculate a set of process tool correctables based on the metrology measurements received from detector 130 and feed the corrections back to a process tool 105 (e.g., scanner).

Measurement and calculation techniques extendable to imaging-based overlay metrology described herein are described in U.S. Pat. No. 8,330,281 issued on Dec. 11, 2012; and U.S. Pat. No. 7,355,291, issued on Apr. 8, 2008, which are each incorporated herein by reference in the entirety.

Figure 1E:
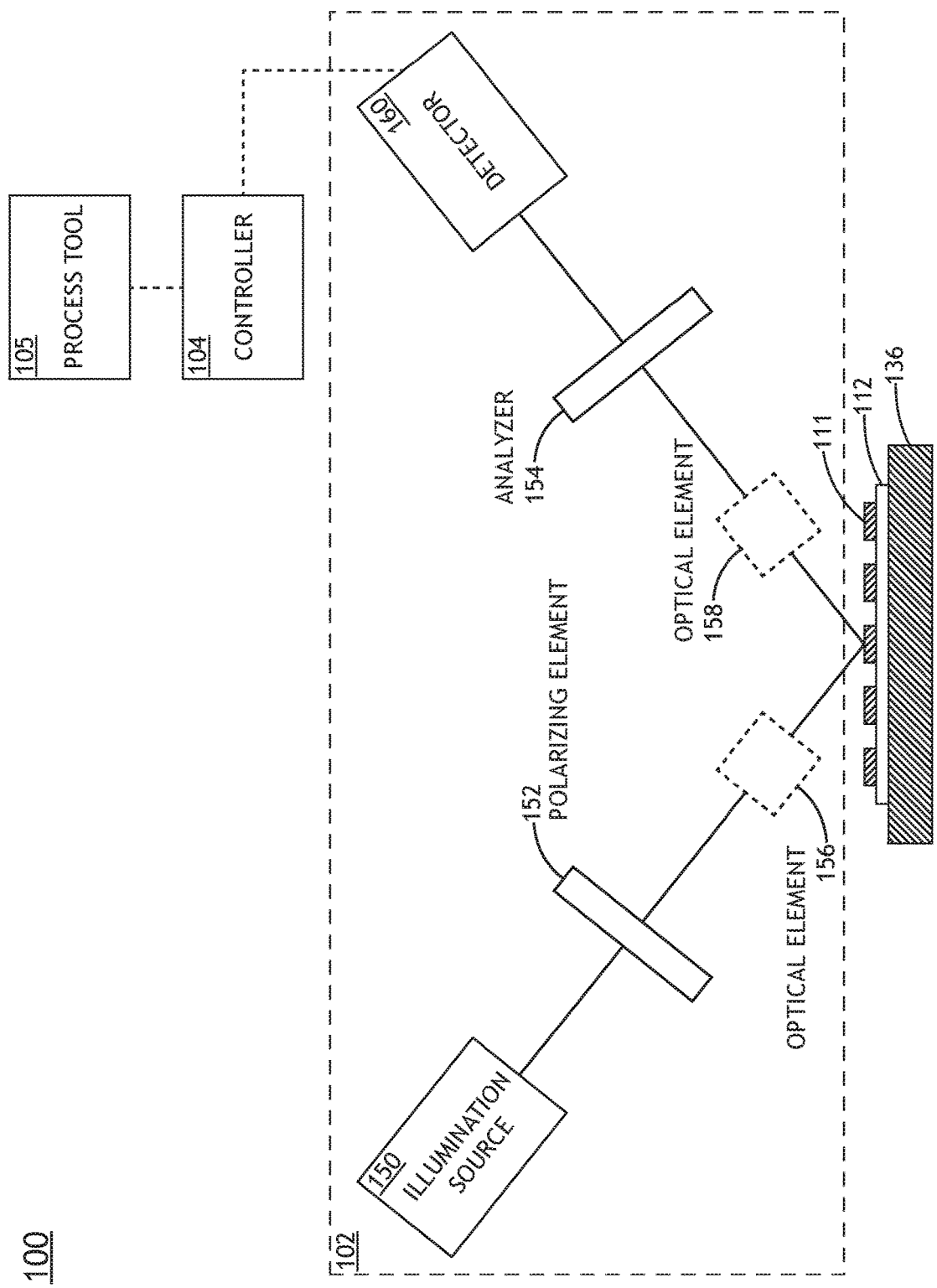
FIG. 1E is a block diagram view of a scatterometry-based metrology system for measuring metrology targets of a semiconductor wafer, in accordance with one embodiments of the present disclosure.

In one embodiment, as shown in FIG. 1E, the metrology sub-system 102 is a scatterometry-based metrology sub-system. For example, the scatterometry-based metrology sub-system is a scatterometry-based overlay metrology tool and is configured to measure a pupil image of one or more targets 111 of wafer 112. By way of another example, the metrology sub-system 102 includes a CD metrology tool suitable for measuring one or more CD parameters from one or more CD targets disposed on the wafer 112. The CD metrology tool may be configured to measure any CD parameter known in the art. For example, the CD metrology tool may measure one or more of the following parameters from one or more CD targets: height, CD (e.g., bottom CD, middle CD or top CD) and side wall angle (SWA) (e.g., bottom SWA, middle SWA or top SWA). In this embodiment, the metrology sub-system 102 may be configured in any manner for carrying out scatterometry or ellipsometry measurements.

In one embodiment, as shown in FIG. 1E, the metrology sub-system 102 may include illumination source 150, polarizing element 152, analyzer 154 and detector 160. In another embodiment, the metrology sub-system 102 may include additional optical elements 156 and 158. For example, the optical elements 156 and 158 may include, but are not limited to, one or more lenses (e.g., focusing lenses), one or more mirrors, one or more filters and/or or one or more collimators.

The use of scatterometry to detect overlay error is described generally in U.S. Pat. No. 9,347,879, issued on May 24, 2016, which is incorporated herein by reference in the entirety. The use of scatterometry to detect overlay error is described generally in U.S. Pat. No. 6,689,519, issued on Feb. 10, 2004, which is incorporated herein by reference in the entirety. The principles of ellipsometry are provided generally in Harland G. Tompkins and Eugene A, Irene, *Handbook of Ellipsometry*, 1st ed, William Andrew, Inc., 2005, which is incorporated herein by reference in the entirety.

Referring again to FIG. 1A, in one embodiment, the system 100 includes a controller 104. In one embodiment, the controller 104 is communicatively coupled to the metrology sub-system 102. For example, as shown in FIGS. 1D-1E, the controller 104 may be coupled to the output of a detector 130, 160 of the metrology sub-system 102. The controller 104 may be coupled to the detector in any suitable manner (e.g., by one or more transmission media indicated by the dotted line) such that the controller 104 can receive the output generated by the metrology sub-system 102.

In one embodiment, the controller 104 includes one or more processors 106. The one or more processors 106 are configured to execute a set of program instructions. The program instructions may carry out any of the process steps described throughout the present disclosure.

The one or more processors 106 of controller 104 may include any one or more processing elements known in the art. In this sense, the one or more processors 106 may include any microprocessor-type device configured to execute software algorithms and/or instructions. In one embodiment, the one or more processors 106 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 108. Moreover, different subsystems of the system 100 (e.g., metrology sub-system, display or user interface) may include processor or logic elements suitable for carrying out at least a portion of the steps described throughout the present disclosure. Therefore, the above description should not be interpreted as a limitation on the present invention but merely an illustration.

The memory medium 108, or memory, may include any storage medium known in the art suitable for storing program instructions executable by the associated one or more processors 106. For example, the memory medium 108 may include a non-transitory memory medium. For instance, the memory medium 108 may include, but is not limited to, a read-only memory, a random access memory, a magnetic or optical memory device (e.g., disk), a magnetic tape, a solid state drive and the like. In another embodiment, it is noted herein that the memory 108 is configured to store one or more results from the metrology sub-system 102 and/or the output of the various steps described herein. It is further noted that memory 108 may be housed in a common controller housing with the one or more processors 106. In an alternative embodiment, the memory 108 may be located remotely with respect to the physical location of the processors 106. For instance, the one or more processors 106 of controller 104 may access a remote memory (e.g., server), accessible through a network (e.g., internet, intranet and the like). In another embodiment, the memory medium 108 includes program instructions for causing the one or more processors 106 carry out the various steps described through the present disclosure.

In another embodiment, the controller 104 of the system 100 may be configured to receive and/or acquire data or information from other systems (e.g., inspection results from an inspection system or metrology results from a metrology system) by a transmission medium that may include wireline and/or wireless portions. In this manner, the transmission medium may serve as a data link between the controller 104 and other subsystems of the system 100. Moreover, the controller 104 may send data to external systems via a transmission medium (e.g., network connection).

In another embodiment, the system 100 includes a user interface (not shown) one embodiment, the user interface is communicatively coupled to the one or more processors 106 of controller 104. In another embodiment, the user interface device may be utilized by controller 104 to accept selections and/or instructions from a user. In some embodiments, described further herein, a display may be used to display data to a user (not shown), In turn, a user may input selection and/or instructions (e.g., a user selection of measured field sites or field sites for regression process) responsive to data displayed to the user via the display device.

The user interface device may include any user interface known in the art. For example, the user interface may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user interface may include, but is not limited to, a bezel mounted interface.

The display device (not shown) may include any display device known in the art. In one embodiment, the display device may include, but is not limited to, a liquid crystal display (LCD). In another embodiment, the display device may include, but is not limited to, an organic light-emitting diode (OLED) based display. In another embodiment, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user interface device (e.g., touchscreen, bezel mounted interface, keyboard, mouse, trackpad, and the like) is suitable for implementation in the present invention.

The embodiments of the system 100 illustrated in FIGS. 1A-1E may be further configured as described herein. In addition, the system 100 may be configured to perform any other step(s) of any of the method embodiment(s) described herein.

Figure 2:
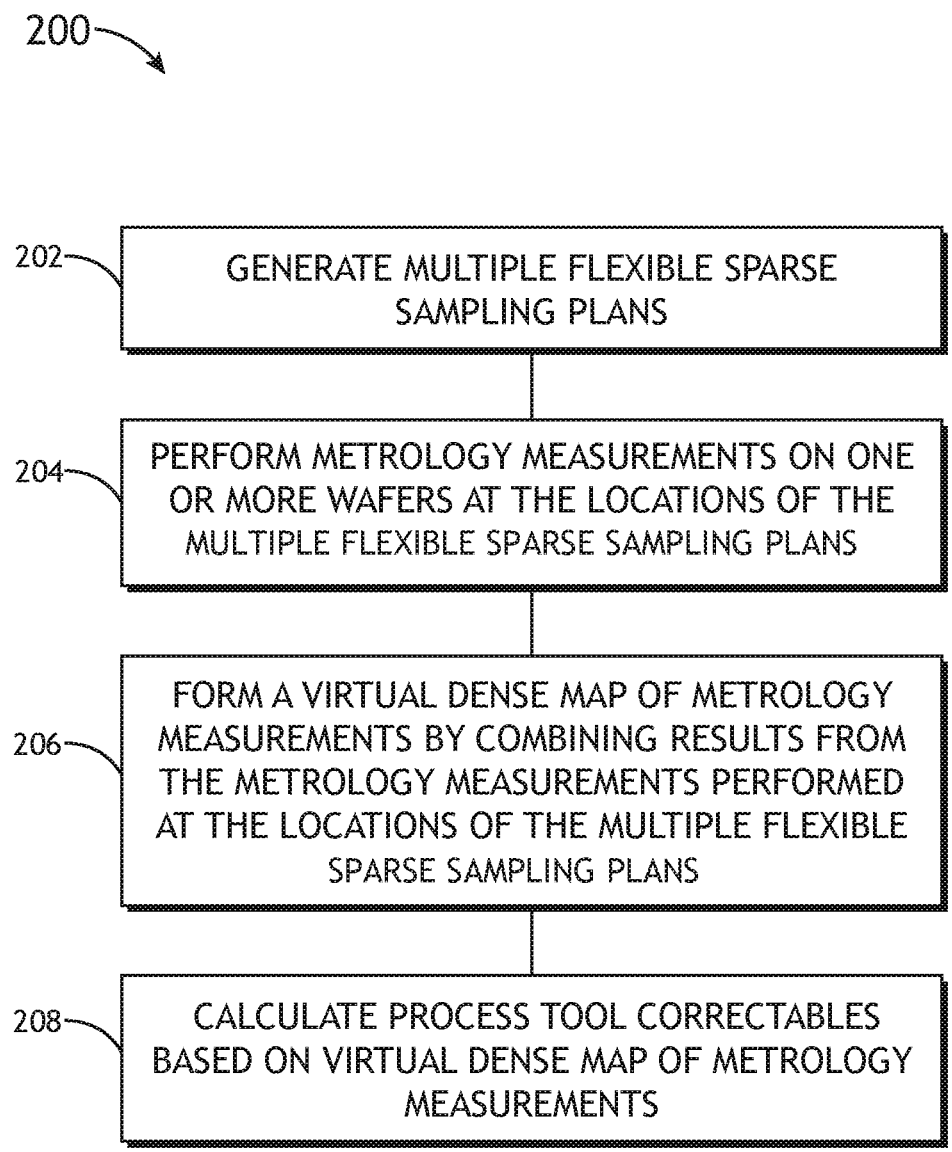
FIG. 2 is a flow diagram illustrating steps performed in a method of providing process tool correctables via multiple flexible sparse sampling plans, in accordance with one or more embodiment of the present disclosure.

FIG. 2 is a flow diagram illustrating steps performed in a method 200 of process control with multiple flexible sparse sampling plans, in accordance with one or more embodiments of the present disclosure.

In step 202, multiple flexible sparse sampling plans are generated. The utilization of flexible sparse sampling plans allows for the optimization (or at least improvement) of sampling based on accuracy/independent metric information collection from the metrology sub-system 102. The metrology sub-system 102 may be a standalone metrology tool, an integrated metrology tool (e.g., scatterometry or imaging based metrology tool) or a combination thereof. The accuracy/independent metric information based optimization of this approach serves to reduce sampling size and metrology measurement duration by selecting a sub-set of measured targets that represent the full or sufficient set of targets. Approaches for generating the flexible sparse sampling plans based on independent metric information, such as accuracy merit values, are described in additional detail further herein.

In step 204, metrology measurements are performed on one or more wafers at the locations of the multiple flexible sparse sampling plans. In step 206, a virtual dense map of metrology measurements is formed by combining results from the metrology measurements performed at the locations of the multiple flexible sparse sampling plans. The application of the flexible sparse sampling plans of the present disclosure allows for the creation of field-by-field corrections from the virtual dense map generated in step 206. Such an approach does not require a periodic dense map measurement.

Further, the formation of the virtual grid map of step 206 does not merely involve a composite of the multiple flexible sampling plans. Rather, the formation of the virtual dense map first includes the removal of the grid signature from each flexible sampled wafer via controller 104. Then, one or more algorithms executed by controller 104 may apply a weighted combination of neighboring field info for each field, thereby filtering out noise. The noise filtering capabilities of method 200 become particularly useful as wafer-to-wafer and lot-to-lot variations increase. By using such an approach, zonal variations over the wafer 112 may be captured more accurately and field-by-field corrections may be calculated using the virtual dense map.

Figure 3A:
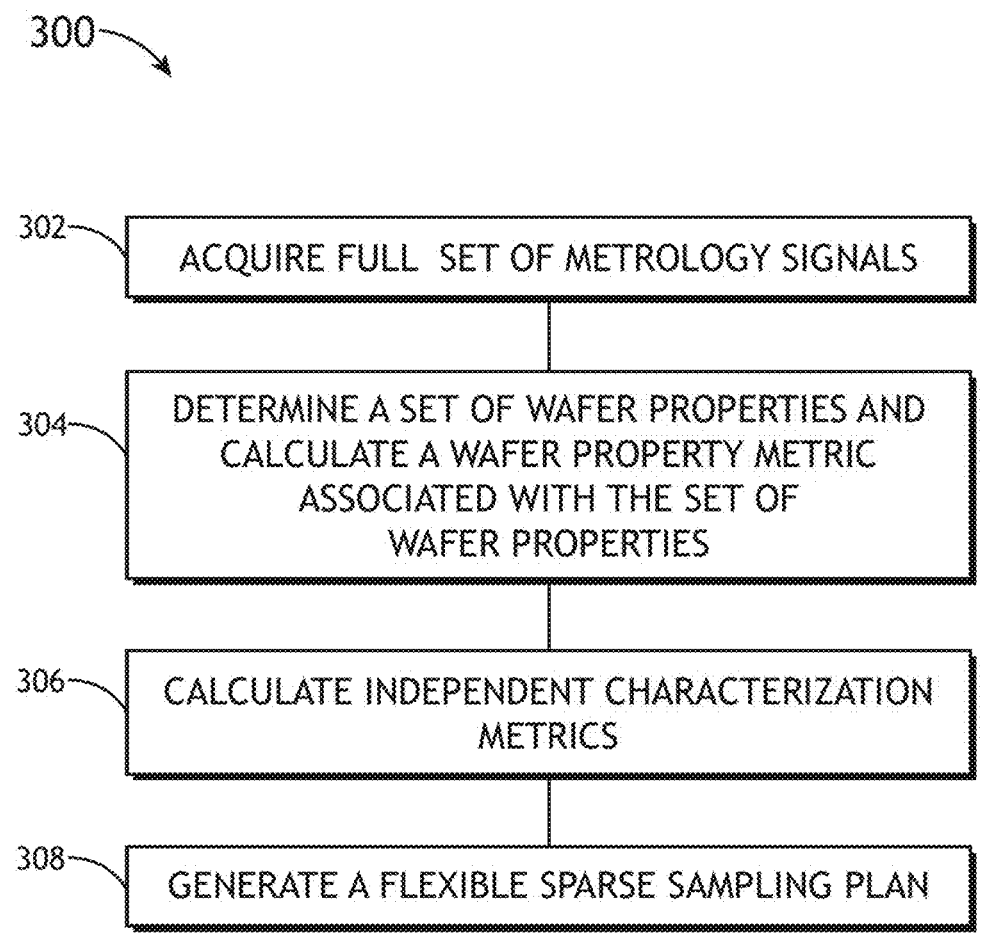
FIG. 3A is a flow diagram illustrating steps performed in a method of generating one or more flexible sparse sampling plans, in accordance with one embodiment of the present disclosure.

In step 208, process tool correctables are calculated based on virtual dense map of metrology measurements. For example, upon formation of the virtual dense sample map including the various metrology signals associated with the locations of the virtual dense sample map, the controller 104 may calculate one or more correctables based on the virtual dense sample map. The correctables may be calculated utilizing any known correctable calculation procedure known in the art of process tool correction. In an additional step, the process tool correctables are used to adjust one or more process tools 105. For example, as shown in FIG. 1A, once the process tool correctables are calculated with controller 104, the controller 104 may adjust one or more operational parameters of the process tool 105 (e.g., scanner). The calculation of process tool correctables and the use of overlay functions in the calculation of the process tool correctables are described in U.S. Pat. No. 7,876,438, issued on Jan. 25, 2011, which is incorporated herein by reference in the entirety. Examples of modeling used within the context of semiconductor metrology systems are generally described in U.S. Pat. Nos. 6,704,661; 6,768,967; 6,867,866; 6,898,596; 6,919,964; 7,069,153; 7,145,664; 7,873,585; and 7,933,026, all of which are incorporated herein by reference in their entirety, FIG. 3A is a flow diagram illustrating steps performed in a method 300 of generating a flexible sparse metrology sampling plan, in accordance with one embodiment of the present disclosure. It is noted herein that the steps of method 300 may be implemented all or in part by the system 100. It is further recognized, however, that the method 300 is not limited to the system 100 in that additional or alternative system-level embodiments may carry out all or part of the steps of method 300. Further, it is noted herein that the steps and embodiments associated with method 200 described previously herein are interpreted to extend to method 300. In this regard, the steps of method 200 and method 300 may be combined in any suitable manner.

In step 302, a full set of metrology signals from the one or more wafers 112 is acquired. For example, as shown in FIG. 1A, metrology sub-system 102 acquires one or more metrology measurements from one or more wafers 112 and transmits the measurements to controller 104. For instance, the metrology sub-system 102 may collect a full or sufficient set of metrology signals from a representative set of wafers 112 of a lot of wafers. It is noted that the full sampling of step 302 is not bounded to measuring a single wafer, but can be composed of sub-sampling from different wafers.

In one embodiment, the metrology sub-system 102 may include an imaging-based metrology tool (see FIG. 1D) configured to collect one or more images of one or more targets 111. In another embodiment, the metrology subsystem 102 may include a scatterometry-based metrology tool (see FIG. 1E) configured to collect light scattered or reflected (or otherwise emanating) from the wafer 112. For example, the metrology signals collected by the metrology sub-system 102 may include one or more scatterometry-based pupil images collected from scatterometry overlay (SCOL) targets and/or multi-layer SCOL targets via the metrology sub-system 102. By way of another example, the metrology signals collected by the metrology sub-system 102 may include one or more contrast-based field images collected from image based overlay (IBO) targets and/or multi-layer IBO targets via the metrology sub-system 102.

The metrology signals acquired in step 302 may be acquired from any number of locations on the wafer 112. For example, the metrology signals may be collected from any of the targets 111 of the wafer 112. In one embodiment, the metrology signals may be collected from a set of like targets. In another embodiment, the metrology signals may be collected from different types of targets. For example, a portion of the metrology signals may be collected from a first type of overlay metrology target, while a second portion of the metrology signals are collected from a second type of overlay metrology target and so on. By way of another example, a portion of the metrology signals may be collected from an overlay metrology target, while a second portion of the metrology signals are collected from an optical CD and/or focus/dose targets.

It is noted that the terms "full set of metrology signals" and "sufficient set of metrology signals" are used interchangeably herein and are interpreted to describe the level of signal acquisition in which the addition of one or more metrology signals would not improve process control or tracking.

In step 304, a set of wafer properties are determined and a wafer property metric associated with the set of wafer properties is calculated. For example, the controller 104, after receiving the full set of metrology signals from the metrology sub-system 102, may determine a set of wafer properties from the full set of metrology signals. In turn, the controller 104 may calculate one or more wafer property metrics associated with the set of wafer properties. For example, the controller 104 may determine a set of overlay values corresponding with each location of the full set of metrology signals. In turn, the controller 104 may calculate one or more metrics associated with the set of overlay values. For instance, the controller 104 may determine one or more statistical metrics associated with the distribution of overlay values acquired with the full sampling plan. The one or more statistical metrics may include any statistical metric known in the art. For example, the controller 104 may calculate a mean, standard deviation ($\sigma$) or a multiple thereof (e.g., $3\sigma$) and etc. associated with the overlay value distribution obtained with the full sampling plan.

By way of another example, the controller 104 may determine a set of SWA values corresponding with the targets at the locations of the full set of metrology signals from a previous layer. In turn, the controller 104 may calculate one or more metrics associated with the set of SWA values. For instance, the controller 104 may determine one or more statistical metrics associated with the distribution of SWA values acquired with the full sampling plan. For example, the controller 104 may calculate a mean, standard deviation ($\sigma$) or a multiple thereof (e.g., $3\sigma$) and etc. associated with the SWA value distribution obtained with the full sampling plan. It is noted that the scope of the present disclosure is not limited to the examples provided above. It is recognized herein that the present disclosure may be extended to any wafer property known in the art (e.g., CD values) and any wafer property metric (e.g., statistical metrics) known in the art.

In step 306, one or more independent characterization metrics are calculated. For the purposes of the present disclosure, the term "independent characterization metric" is interpreted to mean a characterization metric that is independent of the wafer property selected for control (e.g., overlay, SWA, CD and etc.) calculated in step 304, but provides additional information about the given wafer property. For example, the one or more independent characterization metrics may include one or more accuracy merits. For instance, the one or more accuracy merits may include, but are not limited to, an overlay target accuracy metric, such as an overlay target accuracy flag. For instance, one such overlay target accuracy flag is the pupil $3\sigma$ accuracy flag. The pupil $3\sigma$ flag is derived by measuring a pupil image and calculating $3\sigma$ for all pixels in the pupil. The pupil $3\sigma$ flag is representative of the target quality and other accuracy related issues, such as arcs. The relationship between overlay and the pupil $3\sigma$ accuracy flag is described by Gutjahr et al. in *Root cause analysis of overlay metrology excursions with scatterometry overlay technology (SCOL)*, Proc. SPIE 9778, Metrology, Inspection, and Process Control for Microlithography (Mar. 24, 2016).

It is noted that the scope of the present disclosure is not limited to the overlay target accuracy flag as discussed above. The one or more independent characterization metrics of step 306 may extend to any characterization metric or accuracy merit known in the art of wafer metrology, such as, but not limited to, a process signature metric (e.g., PSQ), a patterned wafer geometry metric (e.g., PWG), an overlay target asymmetry metric (e.g., Qmerit) and overlay target accuracy metric (e.g., overlay target accuracy flag). These metrics may be used to identify changes in overlay signature, problematic areas on wafer, locations to measure more densely for diagnosis purposes and locations to avoid due to measurement unreliability and etc. A quality metric for measuring overlay target asymmetry (i.e., Qmerit) is described in U.S. patent application Ser. No. 13/508,495, filed on May 7, 2012, which is incorporated herein by reference in the entirety.

Figure 3B:
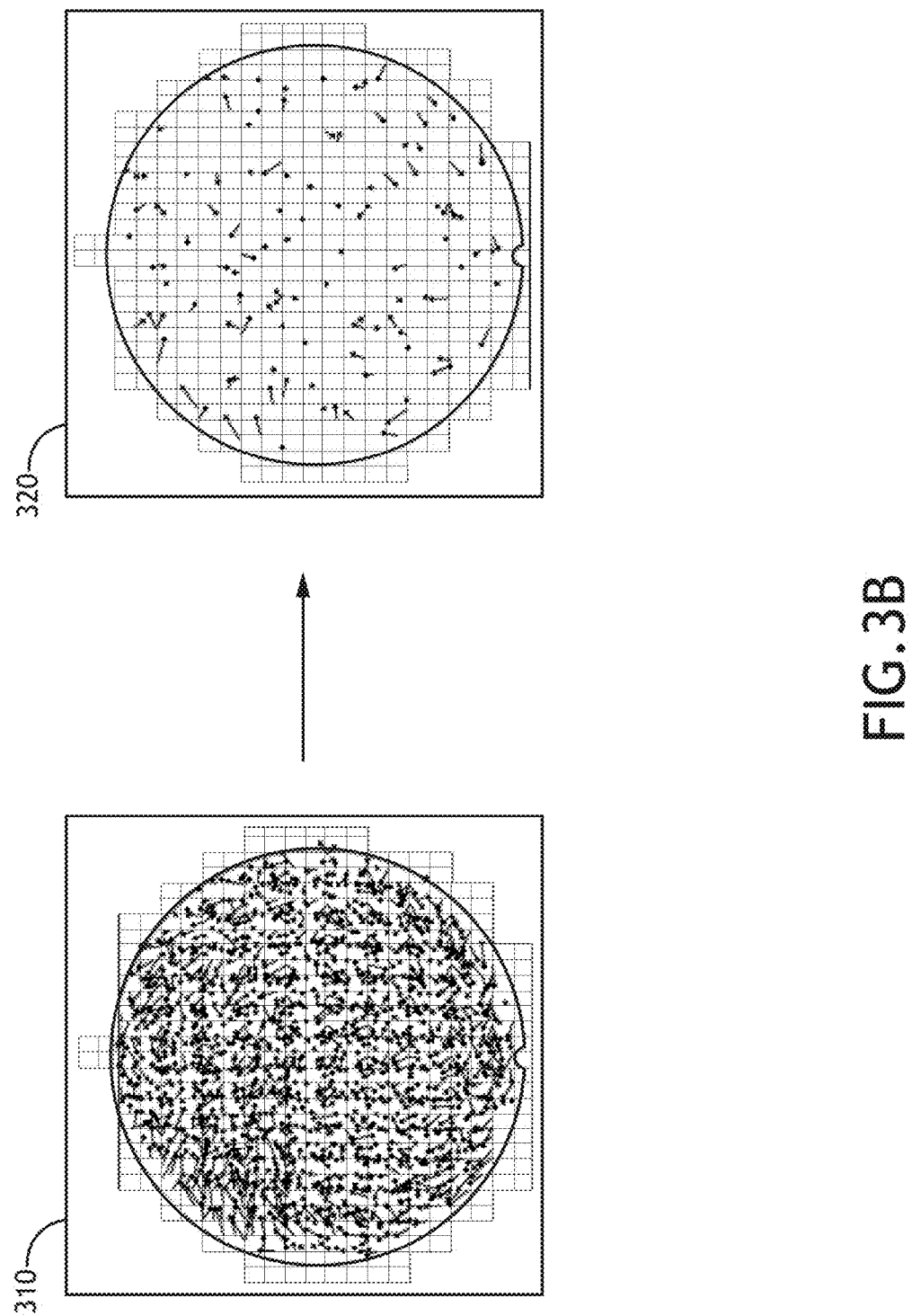
FIG. 3B is a top plan view of a full sampling plan and a flexible sparse sampling plan, in accordance with one embodiment of the present disclosure.

In step 308, one or more flexible sparse sampling plans are generated. FIG. 3B illustrates a conceptual view of a full sampling plan 310 and a flexible sparse sampling plan 320. In one embodiment, the one or more flexible sparse sampling plans are generated based on the set of wafer properties, the wafer property metric, and/or the one or more independent characterization metrics.

In one embodiment, the one or more flexible sparse sampling plans are generated such that the one or more independent characterization metrics of the one or more wafer properties acquired with the flexible sparse sampling plan are equivalent (within a selected tolerance level) to the one or more independent characterization metrics of the one or more wafer properties acquired with the full set of metrology signals.

In one embodiment, the one or more flexible sparse sampling plans are generated such that the one or more independent characterization metrics of the one or more wafer properties acquired with the flexible sparse sampling plan and the one or more independent characterization metrics of the one or more wafer properties acquired with the full set of metrology signals are defined as equivalent if within a selected threshold of one another. In another embodiment, the one or more flexible sparse sampling plans are generated such that the one or more independent characterization metrics of the one or more wafer properties acquired with the flexible sparse sampling plan and the one or more independent characterization metrics of the one or more wafer properties acquired with the full set of metrology signals are defined as equivalent if within a statistical parameter of one another (e.g., multiple of $\sigma$).

In one embodiment, the one or more flexible sparse sampling plans are generated by co-optimizing all of the wafer properties simultaneously. For example, the wafer properties, corresponding accuracy metric, target layout and signal parameters (e.g., intensity, sensitivity and etc.) may be optimized to find the most accurate set of results. In another embodiment, for at least one wafer property, at least one wafer property metric is involved in the co-optimization of the wafer properties.

In one embodiment, the multiple flexible sparse sampling plans are generated so that each of the wafers within in a wafer lot, or each consecutive lot, uses a different sampling plan from the other wafers. In one embodiment, the flexible sparse plans are generated such that they are distributed uniformly over the one or more wafers 112 and meet local and global test balancing criteria (i.e., balanced test repeats). It is noted that, in the case of overlay measurements, these properties give flexible sparse sampling plans the capability to accurately model grid overlay. In another embodiment, the flexible sparse sampling plans generated in step 308 may be used to filter grid noise out of the metrology signals measured from each wafer. It is noted that grid overlay is representative of the degree by which exposure fields are misregistered.

In addition, the one or more flexible sparse sampling plans 320 provide accuracy and robustness at small sample sizes. As a result, flexible sparse sampling plans 320 can be used with integrated metrology tools at very small sample sizes (e.g., 20-50 target/wafer) to measure each wafer within a given wafer lot and filter out wafer to wafer grid variation before calculating composite field-by-field corrections for the next lot. Flexible sparse sampling plans 320 can be generated such that each flexible sparse sampling plan has a specific amount of overlap with the remaining sampling plans, while meeting the same balancing criteria as static sampling plans.

For example, a user can minimize overlap between flexible sparse sampling plans 320 in order to maximize (or at least increase) the total targets measured by different sampling plans. By way of another example, a use may utilize some overlap between flexible sparse sampling plans 320 to consistently compare multiple wafers within each other. The flexible sampling approach of the present disclosure also includes run-time updates to the flexible sparse sampling plans 320 based on the independent characterization metrics, such as, but not limited to, a process signature metric (e.g., PSQ), a patterned wafer geometry metric (e.g., PWG), an overlay target asymmetry metric (e.g., Qmerit) and overlay target accuracy metric (e.g., overlay target accuracy flag).

Figure 4:
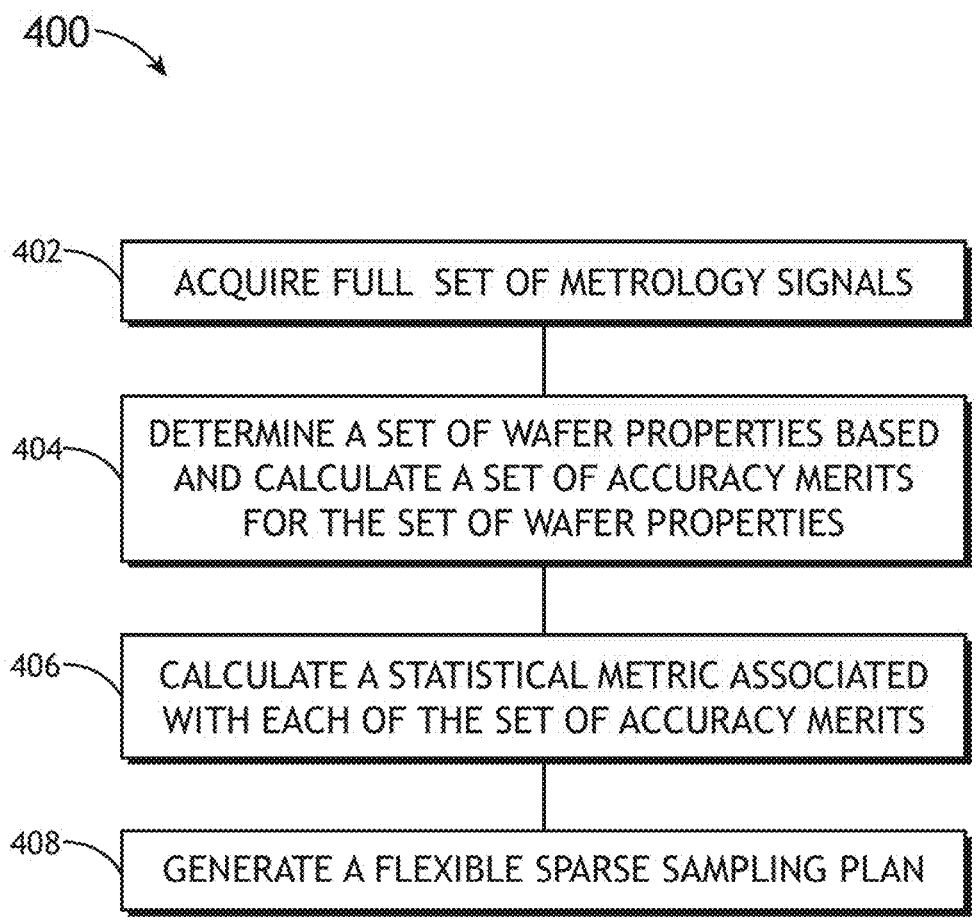
FIG. 4 is a flow diagram illustrating steps performed in a method of generating one or more flexible sparse sampling plans, in accordance with one embodiment of the present disclosure.

FIG. 4 is a flow diagram illustrating steps performed in a method 400 of generating a flexible sparse metrology sampling plan, in accordance with one embodiment of the present disclosure. It is noted herein that the steps of method 400 may be implemented all or in part by the system 100. It is further recognized, however, that the method 400 is not limited to the system 100 in that additional or alternative system-level embodiments may carry out all or part of the steps of method 400. Further, it is noted herein that the steps and embodiments associated with method 200 and 300 described previously herein are interpreted to extend to method 400. In this regard, the steps of methods 200, 300 and 400 may be combined in any suitable manner.

In step 402, a full set of metrology signals from the one or more wafers 112 is acquired. In step 404, a set of wafer properties are determined and a set of accuracy merits associated with the set of wafer properties is calculated. In step 406, a statistical metric associated with each of the set of accuracy merits for the set of wafer properties is calculated. In step 408, a flexible sparse sampling plan based on the statistical metrics associated with each of the set of accuracy merits is generated.

The calculated accuracy merit may be represented symbolically as follows:
$$<OV\_A^m>i,j$$
where OVL_A represents an accuracy merit associated with overlay, m represents the type of accuracy merit and i, j represent target locations on the wafer. It is noted that the above description is not limited to overlay and may be extended to any type of wafer property, such as, but not limited to, one or more CD parameters (e.g., SWA), As discussed previously herein, the types of accuracy merits may include, but are not limited to, a process signature metric (e.g., PSQ), a patterned wafer geometry metric (e.g., PWG), an overlay target asymmetry metric (e.g.; Qmerit) and overlay target accuracy metric (e.g., overlay target accuracy flag).

The statistical metric associated with each of the set of accuracy merits for the set of wafer properties may include any statistical metric known in the art. For example, the statistical metric calculated in step 406 may include, but is not limited to, a mean value of the wafer property distribution (e.g., normal distribution), the standard deviation or the like.

In one embodiment, the flexible sparse sampling plan of step 408 is generated by identifying target locations within the full sampling plan displaying accuracy merit values below a statistically defined threshold. For example, for each accuracy merit type, the statistically defined threshold may include a multiple of $\sigma$ above the mean value of the accuracy merit. For instance, the statistically defined threshold may include the following:
$$<OVL\_A^m>i,j+3\sigma[<OVL\_A^m>i,j]$$
In the statistically defined threshold above, the flexible sparse sampling plan will consist of the target locations having an accuracy merit that is below the sum provided above.

In another embodiment, selected areas of the wafer may be selectively targeted. In one embodiment, the calculation of one or more statistical metrics of step 404 may include calculating one or more statistical metrics associated with each of the set of accuracy merits for the set of wafer properties for at least one of the center of the one or more wafers or the edges of the one or more wafers. In turn, a statistically defined threshold may be applied to the set of accuracy merits using the one or more statistical metrics associated with the accuracy merits acquired from the center and/or edges of one or more wafers.

In an alternative embodiment, the flexible sparse sampling plan may be generated using a selected threshold level. In this regard, the method 400 may be executed without step 406. For example, a flexible sparse sampling plan may be generated by identifying target locations within the full sampling plan displaying accuracy merit values below a selected threshold for each accuracy type.

All of the methods described herein may include storing results of one or more steps of the method embodiments in a storage medium. The results may include any of the results described herein and may be stored in any manner known in the art. The storage medium may include any storage medium described herein or any other suitable storage medium known in the art, After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations), Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A metrology system comprising:
a metrology sub-system configured to perform metrology measurements; and
a controller communicatively coupled to one or more portions of the metrology sub-system, the controller including at least one processor configured to execute program instructions configured to cause the at least one processor to:
receive a full set of metrology signals from a plurality of targets on at least one wafer from the metrology sub-system;
determine a set of wafer properties based on the full set of metrology signals and calculate a wafer property metric associated with the set of wafer properties;
calculate one or more independent characterization metrics based on the full set of metrology signals;
generate a flexible sparse sampling plan including a subset of the plurality of targets associated with the full set of metrology signals based on the set of wafer properties, the wafer property metric, and the one or more independent characterization metrics, wherein the flexible sparse sampling plan is generated such that the one or more independent characterization metrics acquired with the flexible sparse sampling plan are equivalent to the one or more independent characterization metrics acquired with the full set of metrology signals within a selected tolerance level; and
direct the metrology sub-system to perform metrology measurements on one or more wafers according to the flexible sparse sampling plan.

2. The metrology system of claim 1, wherein the controller is further configured to:
generate at least one additional flexible sparse sampling plan; and
direct the metrology sub-system to perform metrology measurements on one or more wafers according to the at least one additional flexible sparse sampling plan.

3. The metrology system of claim 1, wherein the controller is further configured to:
combine results from the metrology measurements performed according to the flexible sparse sampling plan and the at least one additional flexible sparse sampling plan to form a virtual dense sample map.

4. The metrology system of claim 3, wherein the controller is further configured to:

calculate one or more correctables based on the virtual dense sample map.

5. The metrology system of claim 4, wherein the controller is further configured to:
adjust operational parameters of at least one process tool based on the one or more correctables for fabricating at least one subsequent wafer.

6. The metrology system of claim 1, wherein the metrology sub-system comprises:
an imaging-based metrology tool.

7. The metrology system of claim 1, wherein the metrology sub-system comprises:
a scatterometry-based metrology tool.

8. The metrology system of claim 1, wherein the metrology sub-system comprises:
an integrated metrology tool.

9. The metrology system of claim 1, wherein the set of wafer properties determined by the controller comprise:
a set of overlay values.

10. The metrology system of claim 1, wherein the set of wafer properties determined by the controller comprise:
a set of side-wall angle values.

11. The metrology system of claim 1, wherein the set of wafer properties determined by the controller comprise:
a set of critical dimension values.

12. The metrology system of claim 1, wherein the wafer property metric calculated by the controller comprises:
a statistical metric.

13. The metrology system of claim 12, wherein the statistical metric comprises:
at least one of a mean or a standard deviation.

14. The metrology system of claim 1, wherein the one or more independent characterization metrics are independent of the set of wafer properties.

15. The metrology system of claim 1, wherein the one or more independent characterization metrics comprises:
one or more accuracy merits.

16. The metrology system of claim 15, wherein the one or more accuracy merits comprise:
at least one of a process signature metric, a pattern wafer geometry metric, an overlay target asymmetry metric or an overlay target accuracy metric.

17. A metrology system comprising:
a metrology sub-system configured to perform metrology measurements; and
a controller communicatively coupled to one or more portions of the metrology sub-system, the controller including at least one processor configured to execute program instructions configured to cause the at least one processor to:
receive a full set of metrology signals from a plurality of targets on at least one wafer from the metrology sub-system;
determine a set of wafer properties based on the full set of metrology signals and calculate a set of accuracy merits for the set of wafer properties;
calculate a statistical metric associated with each of the set of accuracy merits for the set of wafer properties;
generate a flexible sparse sampling plan including a subset of the plurality of targets associated with the full set of metrology signals based on the statistical metric associated with each of the set of accuracy merits; and
direct the metrology sub-system to perform metrology measurements on one or more wafers according to the flexible sparse sampling plan.

18. The metrology system of claim 17, wherein generating the flexible sparse sampling plan different than the full sampling plan based on the statistical metric associated with each of the set of accuracy merits comprises:
generating the flexible sparse sampling plan by identifying target locations in the full sampling plan with accuracy merit values below a statistically defined threshold.

19. The metrology system of claim 17, wherein the calculating a statistical metric associated with each of the set of accuracy merits for the set of wafer properties comprises:
calculating a statistical metric associated with each of the set of accuracy merits for the set of wafer properties for at least one of a center of the at least one wafer or edges of the at least one wafer.

20. The metrology system of claim 17, wherein the controller is further configured to:
generate at least one additional flexible sparse sampling plan; and
direct the metrology sub-system to perform metrology measurements according to the at least one flexible sparse sampling plan.

21. The metrology system of claim 20, wherein the controller is further configured to:
combine results from the metrology measurements performed according to the flexible sparse sampling plan and the at least one additional flexible sparse sampling plan to form a virtual dense sample map.

22. The metrology system of claim 21, wherein the controller is further configured to:
calculate one or more correctables based on the virtual dense sample map.

23. The metrology system of claim 22, wherein the controller is further configured to:
adjust operational parameters of at least one process tool based on the one or more correctables for fabricating at least one subsequent wafer.

24. The metrology system of claim 17, wherein the metrology sub-system comprises:
an imaging-based metrology tool.

25. The metrology system of claim 17, wherein the metrology sub-system comprises:
a scatterometry-based metrology tool.

26. The metrology system of claim 17, wherein the metrology sub-system comprises:
an integrated metrology tool.

27. The metrology system of claim 17, wherein the set of wafer properties determined by the controller comprise:
a set of overlay values.

28. The metrology system of claim 17, wherein the set of wafer properties determined by the controller comprise:
a set of critical dimension values.

29. The metrology system of claim 17, wherein the set of accuracy merits comprise:
at least one of a process signature metric, a pattern wafer geometry metric, an overlay target asymmetry metric or an overlay target accuracy metric.

30. A metrology system comprising:
a metrology sub-system configured to perform metrology measurements; and
a controller communicatively coupled to one or more portions of the metrology sub-system, the controller including at least one processor configured to execute program instructions configured to cause the at least one processor to:

receive a full set of metrology signals from a plurality of targets on at least one wafer from the metrology sub-system;

determine a set of wafer properties based on the full set of metrology signals and calculate a set of accuracy merits for the set of wafer properties;

generate a flexible sparse sampling plan including a subset of the plurality of targets associated with the full set of metrology signals by identifying target locations within the full sampling plan providing accuracy merit values below a selected threshold; and direct the metrology sub-system to perform one or more metrology measurements on one or more wafers according to the flexible sparse sampling plan.

* * * * *